United States Patent
Lee et al.

(10) Patent No.: US 7,648,654 B2
(45) Date of Patent: Jan. 19, 2010

(54) NONAQUEOUS CONDUCTIVE NANOINK COMPOSITION

(75) Inventors: Kwi-Jong Lee, Hwaseong-si (KR); Dong-Hoon Kim, Seongnam-si (KR); Joon-Rak Choi, Incheon (KR); Jaewoo Joung, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/149,423

(22) Filed: May 1, 2008

(65) Prior Publication Data
US 2009/0078915 A1 Mar. 26, 2009

(30) Foreign Application Priority Data
Sep. 21, 2007 (KR) .................. 10-2007-0096705

(51) Int. Cl.
H01B 1/02 (2006.01)
H01B 1/22 (2006.01)
(52) U.S. Cl. ............... 252/512; 252/513; 252/514
(58) Field of Classification Search ............ 252/512, 252/513, 514
See application file for complete search history.

(56) References Cited

U.S. PATENT DOCUMENTS

| 6,548,175 | B2 * | 4/2003 | Sachdev et al. ............ 428/414 |
| 2004/0191640 | A1 * | 9/2004 | Ray et al. .................... 430/5 |
| 2007/0190323 | A1 * | 8/2007 | Lee et al. ................... 428/402 |

* cited by examiner

*Primary Examiner*—Mark Kopec
*Assistant Examiner*—Jaison P Thomas
(74) *Attorney, Agent, or Firm*—McDermott Will & Emery LLP

(57) ABSTRACT

The present invention relates to a non-aqueous conductive nanoink composition including 20 to 85 parts by weight of metal nanoparticles which is chosen from silver, copper, nickel, platinum, palladium, and gold; 0.5 to 10 parts by weight of a polymer having an anhydride group; 15 to 80 parts by weight of a non-aqueous organic solvent.

The non-aqueous conductive nanoink composition of the present invention prevents cracks during the drying process, increases the adhesion between wiring and substrate, and allows forming conductive wirings and films without cracks and delamination on the substrate such as polymer including polyimide and glass or silicon wafer.

4 Claims, 8 Drawing Sheets

NONAQUEOUS CONDUCTIVE NANOINK COMPOSITION

CROSS-REFERENCE TO RELATED APPLICATION

This application claims the benefit of Korean Patent Application No. 10-2007-0096705 filed on Sep. 21, 2007 with the Korea Intellectual Property Office, the contents of which are incorporated here by reference in their entirety.

BACKGROUND

1. Technical Field

The present invention relates to a nonaqueous conductive nanoink composition and more particularly, to a nonaqueous conductive nanoink composition which is suitable for forming conductive wirings and films with no cracks or delamination on a substrate by employing an anhydride compound.

2. Description of the Related Art

Noncontact direct writing technology through inkjet which is distinguished from the conventional optical patterning offers advantages in reduction of manufacturing costs and time since it allows ejecting an exact amount of ink to only a desired portion. For applying the inkjet method to form a metal wiring of a substrate, a metal ink has been greatly developed with growth of interests in the metal ink.

A method of forming conductive wirings or films generally includes coating or printing a conductive nanoink on a substrate, drying and sintering. Final conductivity is exhibited after the sintering process. The conductivity can be decreased (i) when a content of nanomaterial is low, (ii) when a content of remained organic compounds is high after sintering, (iii) when short/open due to cracks and/or delamination is caused after drying, or (iv) when short/open due to cracks and/or delamination is caused after sintering. When silver or copper is used as a conductive nanomaterial and the sintering is performed sufficiently, reasons (i) and (ii) may be avoid but electric current may be blocked or resistance may be too high due to electrical short associated with reasons (iii) and (iv).

A drying method of nanoink of a substrate includes (i) evaporation, (ii) densification and contraction, (iii) crack initiation due to contraction and non-fluidity, and (iv) crack and delamination. That is, when nanoink is dried on a substrate, contraction may be caused with increase of the concentration of nanoparticles in the nanoink by the evaporation of a solvent. A contact portion with air may be more contracted with more evaporation than the opposite portion to the air-contacted portion and this may cause crack for the contraction at the air-contacted portion. This crack may grow with the evaporation of the solvent and reach to the interface of the opposite portion to the air-contacted portion. As a result, if adhesion at the interface of the opposite portion to the air-contacted portion is not strong enough compared to the contraction stress, it may cause delamination.

Preventing cracks and improving adhesion between wiring and substrate are critical factors in the manufacturing metal nanoink composition and the development of metal nanoink composition which satisfies those factors is highly demanded.

SUMMARY

An aspect of the present invention is to provide a non-aqueous conductive nanoink composition which forms conductive wirings and films without causing cracks or delamination on a substrate by using an anhydride compound.

In order to resolve such problems associated with the conventional method, is a non-aqueous conductive nanoink composition provided, the composition including: 20 to 85 parts by weight of metal nanoparticles which is chosen from silver, copper, nickel, platinum, palladium, and gold; 0.5 to 10 parts by weight of a polymer having an anhydride group; 15 to 80 parts by weight of a non-aqueous organic solvent.

According to an embodiment of the present invention, the polymer including an anhydride group may be at least one chosen from poly(maleic anhydride-alt-octadecene), poly(maleic anhydride-alt-dodecene), poly(maleic anhydride-alt-hexadecene), poly(succinic anhydride-alt-octadecene), poly(succinic anhydride-alt-dodecene) and poly(maleic anhydride-alt-hexadecene).

According to an embodiment of the present invention, the composition may further include a monomer having an anhydride group.

According to an embodiment of the present invention, the monomer having an anhydride group may be chosen from dodecenylsuccinic anhydride(DDSA), hexadecenylsuccinic anhydride(HDSA), and its mixture.

According to an embodiment of the present invention, the non-aqueous organic solvent may be at least one chosen from toluene, hexane, cyclohexane, decane, dodecane, tetradecane, hexadecane, octadecane and octadecene.

The non-aqueous conductive nanoink composition of the present invention prevents cracks during the drying process, increases the adhesion between wiring and substrate, and allows forming conductive wirings and films without cracks and delamination on the substrate such as polymer including polyimide and glass or silicon wafer.

BRIEF DESCRIPTION OF THE DRAWINGS

FIG. 1b is a picture which is 50 times enlarged of FIG. 1a.

FIG. 2b is a picture which is 50 times enlarged of FIG. 2a.

DETAILED DESCRIPTION

Figure 1A:
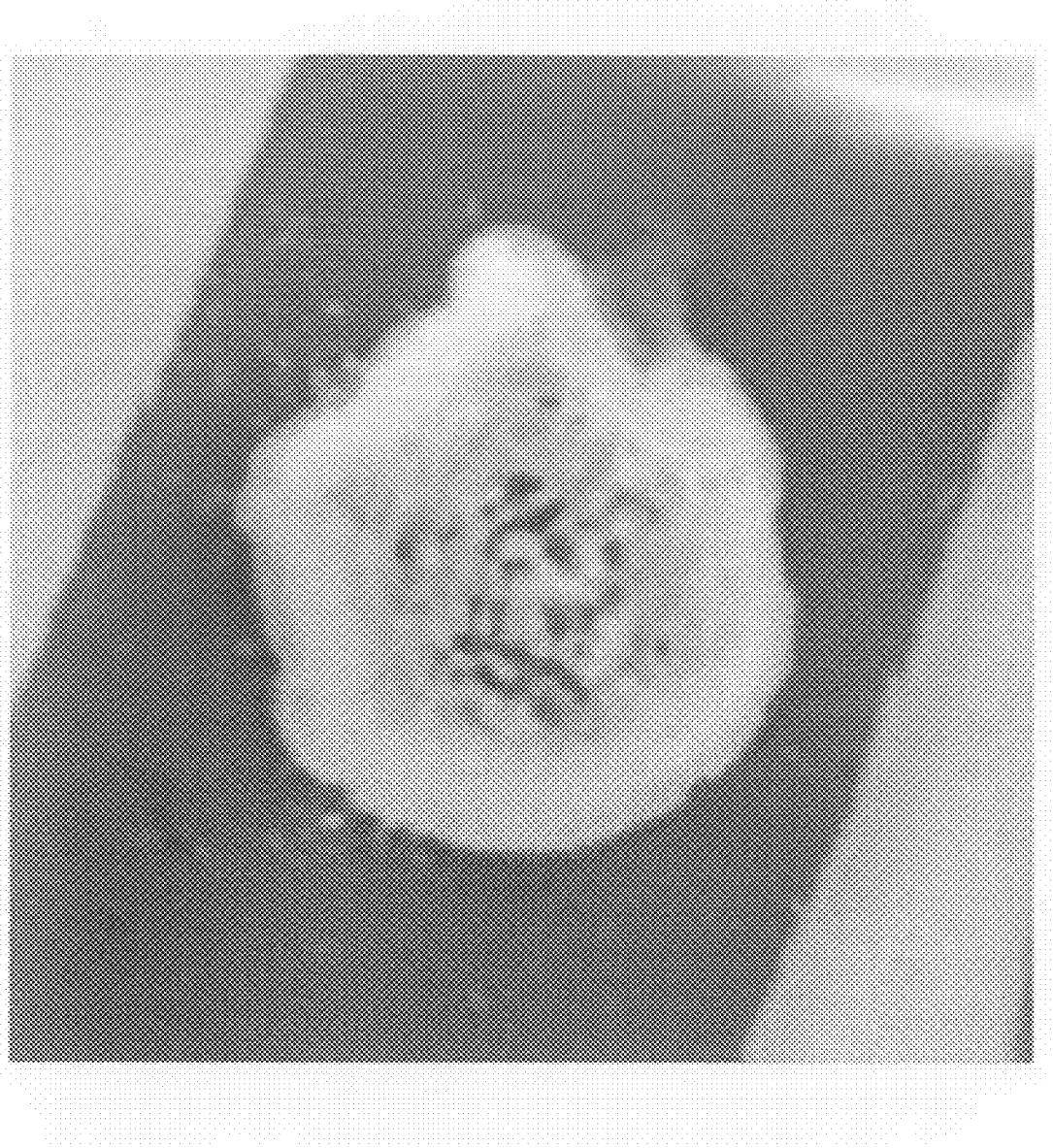
FIG. 1a is a picture of silver nanoink including neither polymer nor monomer produced according to the conventional method after sintering.

Hereinafter, preferred embodiments will be described in detail of the non-aqueous conductive nanoink composition according to the present invention.

The present invention relates to a non-aqueous conductive nanoink composition produced from monolayer-protected nanoparticles(MPC) which exhibits no cracks and improved adhesion and is suitable for forming conductive wirings and films on a glass or silicon wafer or a polymer including polyimide, which is difficult with the conventional ink composition.

The monolayer-protected nanoparticles is a stabilized monomer having thiol, carboxylic acid or amine group at end has uniform particle size and high dispersibility, while nanoparticles stabilized with a polymer such as PVP has relatively poor compared to the monolayer-protected nanoparticles. However, an ink made of the monolayer-protected nanoparticles is generally lipophilic, so that it shows low adhesion to a glass or silicon wafer or a polymer including polyimide and causes the formation of cracks or delamination, while an ink made of nanoparticles stabilized with a polymer is generally hydrophilic, so that it shows adhesion to a glass or silicon wafer or a polymer including polyimide and lowers the formation of cracks or delamination.

For example, when a nanoink made of monolayer-protected silver nanoparticles is coated with polyimide and sintered, it not only causes the formation of cracks and delamination but also blocks electric current due to cracks on the surface of polyimide.

Such cracks generated during the drying process may be reduced by providing fluidity during drying and preventing separation of particles. In order to provide fluidity during drying, a polymer is used in the present invention. Further, in order to provide the adhesion to a substrate, an appropriate functional group is introduced but this functional group is usually hydrophilic and thus it is not suitable for a lipophilic ink. Therefore, a polymer having an anhydride compound, which can be compatible with a lipophilic ink, is used as a crack inhibitor.

The non-aqueous conductive nanoink composition of the present invention includes 20 to 85 parts by weight of metal nanoparticles which is chosen from silver, copper, nickel, platinum, palladium, and gold; 0.5 to 10 parts by weight of a polymer having an anhydride group; 15 to 80 parts by weight of a non-aqueous organic solvent.

The metal nanoparticles may be nanoparticles of silver, copper, nickel, platinum, palladium, or gold and used alone or as a combination thereof. The metal nanoparticles may be added in a content of 20 to 85 parts by weight. When it is less than 20 parts by weight, it may not be suitable for forming wiring due to low metal content, while when it is more than 85 parts by weight, it may not be suitable for ink since the viscosity becomes too high to be ejected.

The polymer having an anhydride group may be poly(maleic anhydride-alt-octadecene), poly(maleic anhydride-alt-dodecene), poly(maleic anhydride-alt-hexadecene), poly(succinic anhydride-alt-octadecene), poly(succinic anhydride-alt-dodecene) or poly(maleic anhydride-alt-hexadecene) but it is not limited to them.

The polymer having an anhydride group may be added in a content of 0.5 to 10 parts by weight. When it is less than 0.5 parts by weight, it may not be enough to prevent cracks, while when it is more than 10 parts by weight, it may cause high resistivity and color changes of wirings to white or yellow due to remained organic compound after sintering.

The non-aqueous conductive nanoink composition may further include a monomer having an anhydride group.

The monomer having an anhydride group may be dodecenylsuccinic anhydride(DDSA), hexadecenylsuccinic anhydride(HDSA), or its mixture but it is not limited to them.

The monomer having an anhydride group may be added in a content of 0.5 to 10 parts by weight. When it is less than 0.5 parts by weight, it may not be enough to prevent the formation of cracks, while when it is more than 10 parts by weight, it may cause high resistivity and color changes of wirings to white or yellow due to remained organic compound after sintering.

When only the polymer having an anhydride group is used, it is excellent to prevent the formation of cracks but the viscosity of ink increases. On the other hand, when only the monomer having an anhydride group is used, the viscosity of ink is not increased but it is poor to prevent the formation of cracks. Therefore, it is apparent that the polymer and the monomer be mixed to control the formation of cracks and the viscosity.

Examples of the non-aqueous organic solvent include toluene, hexane, cyclohexane, decane, dodecane, tetradecane, hexadecane, octadecane and octadecene and tetradecane is preferable. The solvent may be used alone or as a combination.

The non-aqueous organic solvent may be added in a content of 15 to 80 parts by weight. It is preferable to use minimum amount of the organic solvent to maximize the concentration of metal. When it is less than 15 parts by weight, it may show not enough dispersibility and block a nozzle since an inkjet head get dried too quickly, while when it is more than 80 parts by weight, it deteriorates reliability of the wiring since the content of metal is relatively lowered and thus it may not be suitable for forming the wiring.

The non-aqueous conductive nanoink composition of the present invention may be further suitable for forming conductive wirings and films by employing the conventional method.

EXAMPLE

While the present invention has been described with reference to particular embodiments, it is to be appreciated that various changes and modifications may be made by those skilled in the art without departing from the spirit and scope of the present invention, as defined by the appended claims and their equivalents. Throughout the description of the present invention, when describing a certain technology is determined to evade the point of the present invention, the pertinent detailed description will be omitted.

Hereinafter, although more detailed descriptions will be given by examples, those are only for explanation and there is no intention to limit the invention.

Example 1

Preparation of Non-Aqueous Conductive Silver Nanoink Composition $AgNO_3$ 5 g was dissociated into butylamine 30 g and then toluene 50 ml, lauric acid 5.6 g, and a reducing agent, TBAB, 1.6 g were added to the reaction mixture, followed by heating to 110° C. A mixture of acetone, ethanol, and methanol was added to precipitate out the silver nanoparticles having a size of 7 nm. The silver nanoparticles 40 parts by weight and poly(maleic anhydride-alt-octadecene) 2 parts by weight were added to tetradecane 58 parts by weight to provide an ink composition with a concentration of 40 wt %. At that time, a content of the polymer was 2 wt %. After a glass was coated with the non-aqueous conductive nanoink composition, it was sintered at 200° C. for 30 minutes. Neither crack nor delamination was observed.

Example 2

Preparation of Non-Aqueous Conductive Silver Nanoink Composition $AgNO_3$ 5 g was dissociated into butylamine 30 g and then toluene 50 ml, lauric acid 5.6 g, and a reducing agent, TBAB, 1.6 g were added to the reaction mixture, followed by heating to 110° C. A mixture of acetone, ethanol, and methanol was added to precipitate out the silver nanoparticles having a size of 7 nm. The silver nanoparticles 40 parts by weight, poly(maleic anhydride-alt-octadecene) 1 part by weight, and a monomer(DDSA) 1 part by weight were added to tetradecane 59 parts by weight to provide an ink composition with a concentration of 40 wt %. At that time, a content of the polymer was 1 wt %. After a glass was coated with the non-aqueous conductive nanoink composition, it was sintered at 200° C. for 30 minutes. Neither crack nor delamination was observed.

Example 3

Preparation of Non-Aqueous Conductive Copper Nanoink Composition

After $Cu(NO_3)_2$ 0.5 mol was added to oleic acid 2 mol, butylamine 1 mol was added to dissociate. The reaction mixture was turned to clear green color. The reaction was heated to 200° C. while stirring. The reaction mixture was then turned to brown color and copper color was shown inside the wall of a reactor while the reduction was preceded. After 2 hours, a mixture of acetone and methanol was added to re-precipitate copper nanoparticles which were isolated by a centrifuge.

The produced copper nanoparticles having a size of 4 nm 40 parts by weight and poly(maleic anhydride-alt-octadecene) 2 parts by weight were added to tetradecane 58 parts by weight to provide an ink composition having a concentration of 40 wt %. At that time, a content of the polymer was 2 wt %. After a glass was coated with the non-aqueous conductive nanoink composition, it was sintered at 200° C. for 1 hour. Neither crack nor delamination was observed.

Example 4

Preparation of Non-Aqueous Conductive Copper Nanoink Composition

After $Cu(NO_3)_2$ 0.5 mol was added to oleic acid 2 mol, butylamine 1 mol was added to dissociate. The reaction mixture was turned to clear green color. The reaction was heated to 200° C. while stirring. The reaction mixture was then turned to brown color and copper color was shown inside the wall of a reactor while the reduction was preceded. After 2 hours, a mixture of acetone and methanol was added to re-precipitate copper nanoparticles which were isolated by a centrifuge.

The produced copper nanoparticles having a size of 4 nm 40 parts by weight and poly(maleic anhydride-alt-octadecene) 1 part by weight were added to tetradecane 59 parts by weight to provide an ink composition having a concentration of 40 wt %. At that time, a content of the polymer was 1 wt %. After a glass was coated with the non-aqueous conductive nanoink composition, it was sintered at 200° C. for 1 hour. Neither crack nor delamination was observed.

Figure 1B:
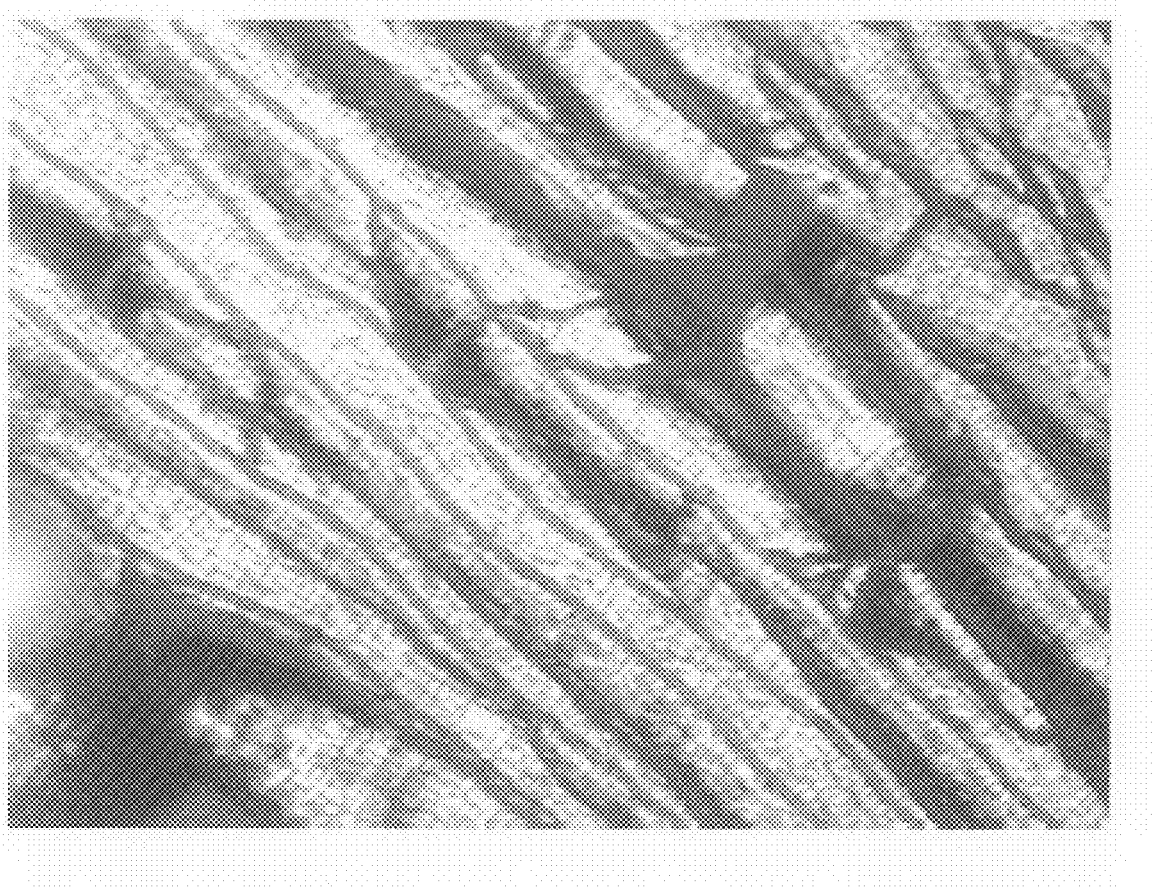

FIG. 1a is a picture of a film produced according to the conventional method and FIG. 1b is a picture which is 50 times enlarged of FIG. 1a. When non-aqueous conductive nanoink composition includes the neither polymer nor monomer, cracks and delamination were significantly observed as shown in FIGS. 1a and 1b.

Figure 2A:
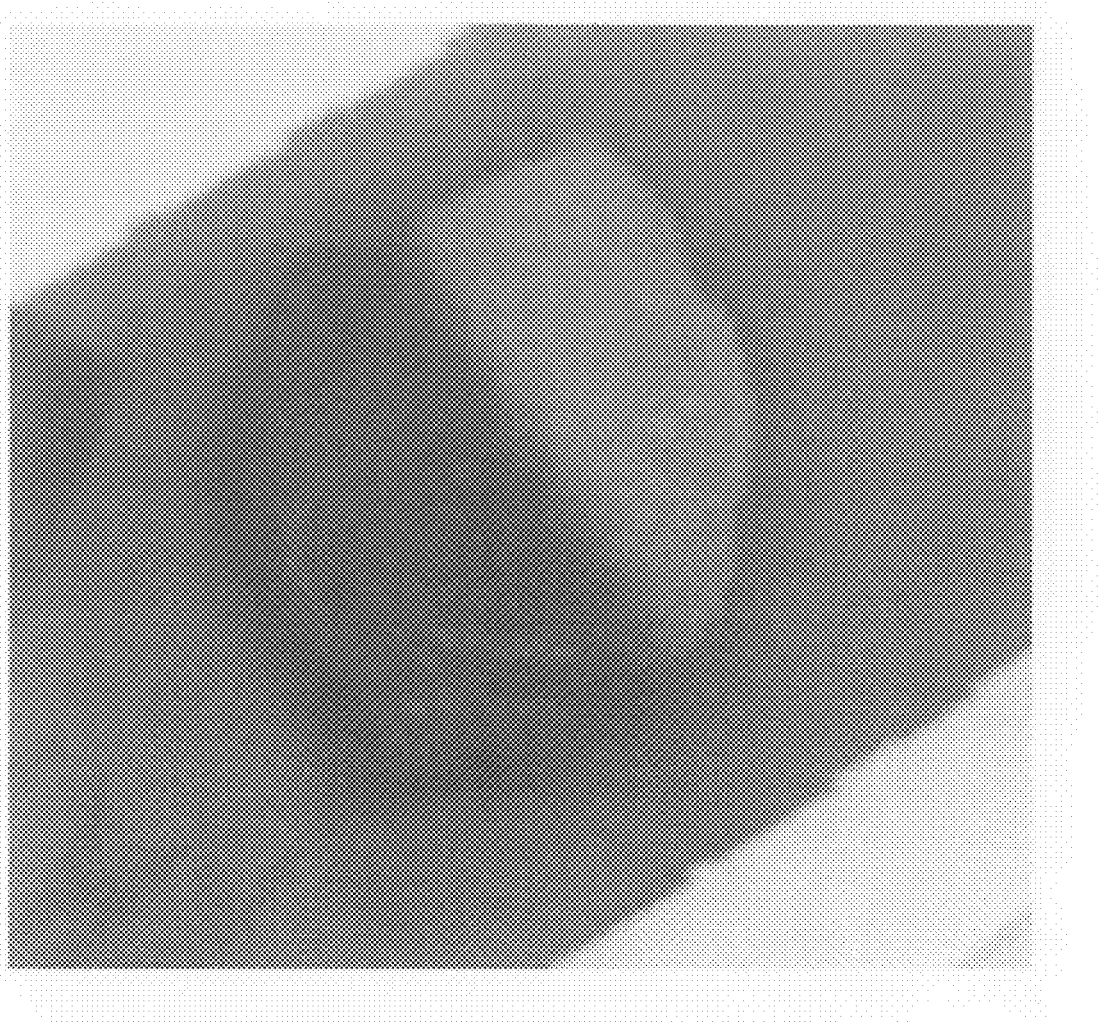
FIG. 2a is a picture of silver nanoink produced in Example 1 after sintering.
Figure 2B:
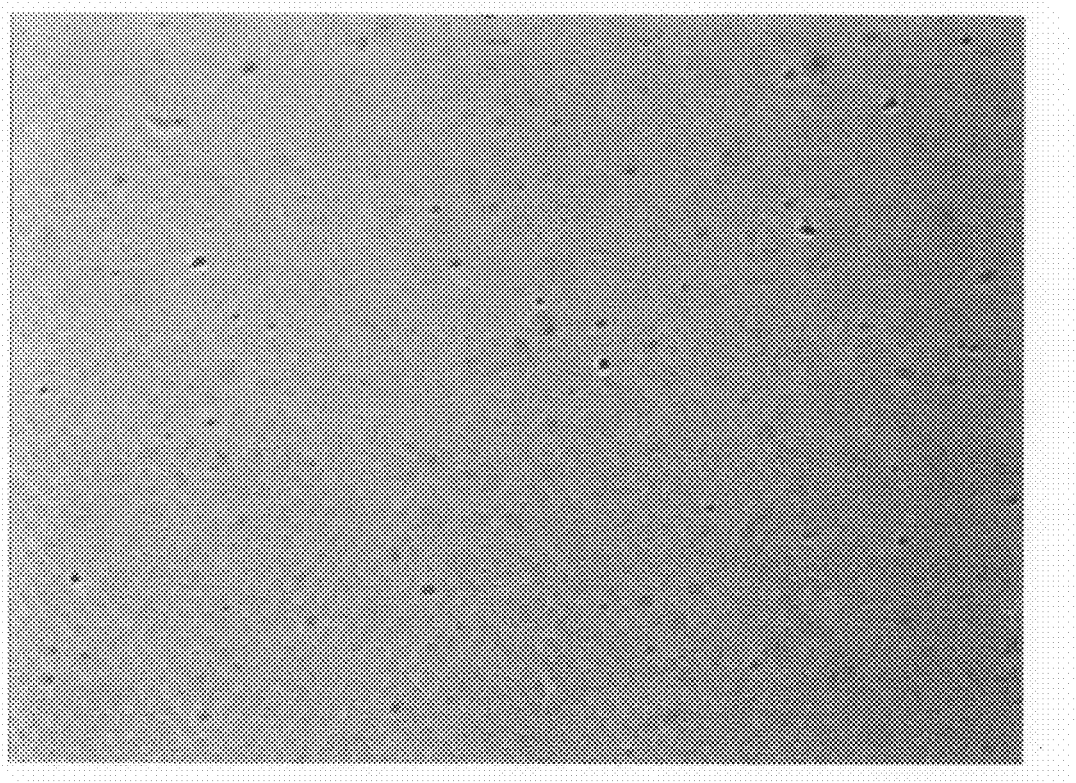
Figure 2C:
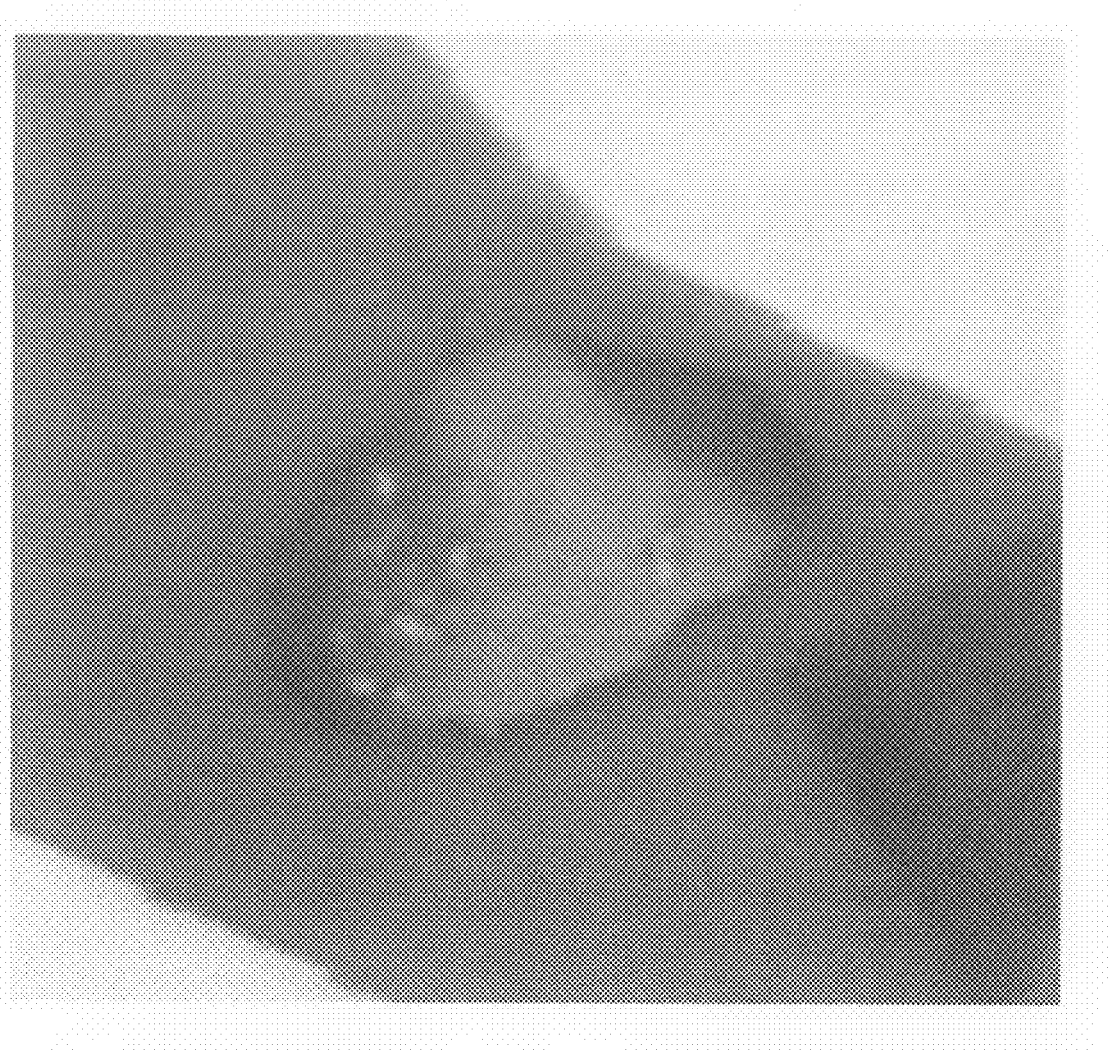
FIG. 2c is a picture of silver nanoink produced in Example 2 after sintering.
Figure 2D:
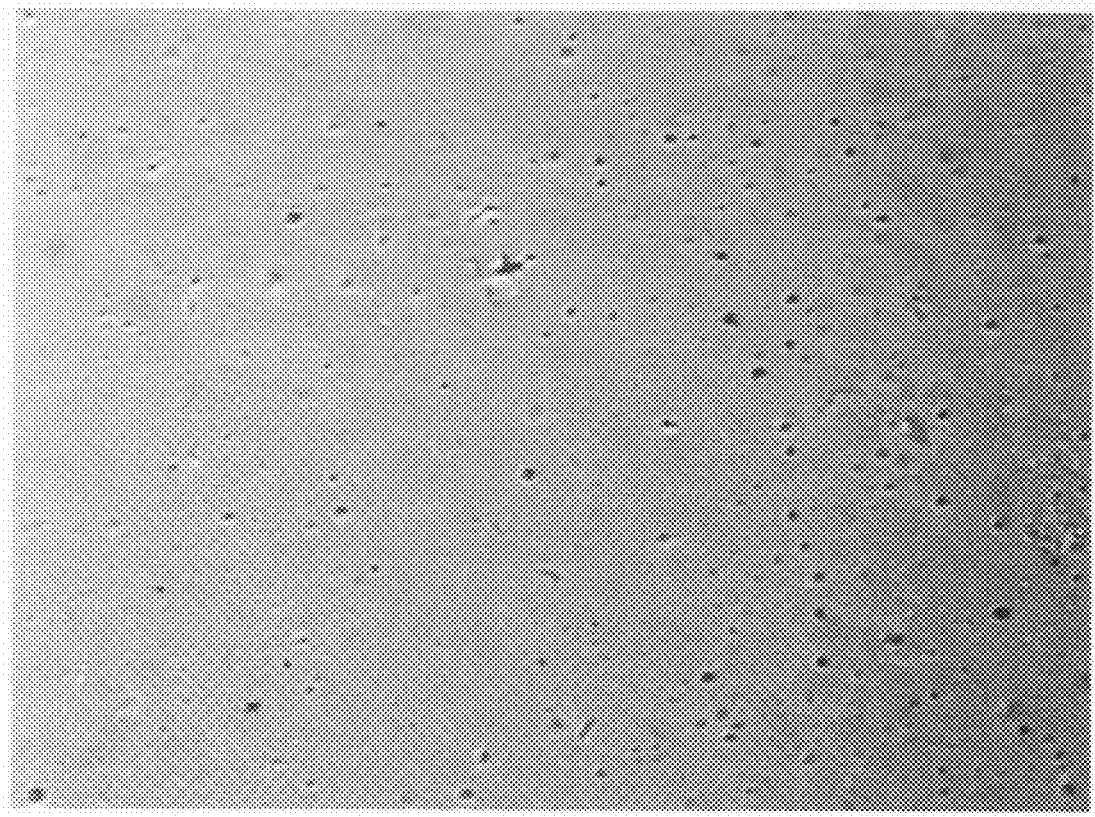
FIG. 2d is a picture which is 50 times enlarged of FIG. 2c.

FIG. 2a is a picture of silver nanoink produced in Example 1 after sintering and FIG. 2b is a picture which is 50 times enlarged of FIG. 2a. FIG. 2c is a picture of silver nanoink produced in Example 2 after sintering and FIG. 2d is a picture which is 50 times enlarged of FIG. 2c. It is noted that neither crack nor delamination was observed as shown in FIGS. 2a to 2d.

Figure 3A:
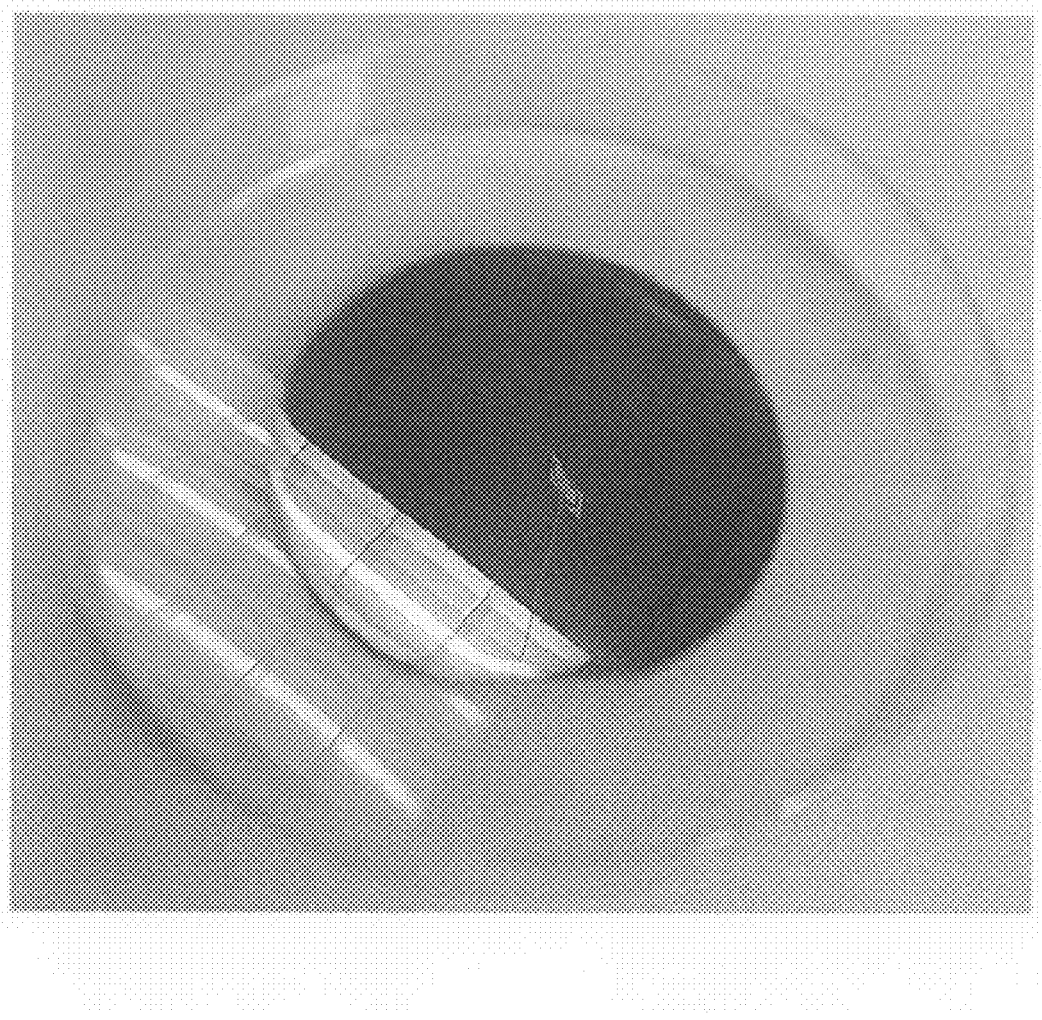
FIG. 3a is a picture of copper nanoink produced in Example 3 after sintering.
Figure 3B:
FIG. 3b is a picture of copper nanoink produced in Example 4 after sintering.

FIG. 3a is a picture of copper nanoink produced in Example 3 after sintering and FIG. 3b is a picture of copper nanoink produced in Example 4 after sintering. It is noted that neither crack nor delamination was observed in FIG. 3a but delamination was observed even though crack was improved in FIG. 3b.

What is claimed is:

1. A non-aqueous conductive nanoink composition comprising:
    20 to 85 parts by weight of metal nanoparticles selected from the group consisting of silver, copper, nickel, platinum, palladium, and gold;
    0.5 to 10 parts by weight of a polymer having an anhydride group, the polymer selected from the group consisting of poly(maleic anhydride-alt-octadecene), poly(maleic anhydride-alt-dodecene), poly(maleic anhydride-alt-hexadecene), poly(succinic anhydride-alt-octadecene), poly(succinic anhydride-alt-dodecene), and poly(maleic anhydride-alt-hexadecene); and
    15 to 80 parts by weight of a non-aqueous organic solvent.

2. The non-aqueous conductive nanoink composition of claim 1, further comprising a monomer having an anhydride group.

3. The non-aqueous conductive nanoink composition of claim 2, wherein the monomer having an anhydride group is selected from the group consisting of dodecenylsuccinic anhydride(DDSA), hexadecenylsuccinic anhydride(HDSA), and its mixture.

4. The non-aqueous conductive nanoink composition of claim 1, wherein the non-aqueous organic solvent is selected from the group consisting of toluene, hexane, cyclohexane, decane, dodecane, tetradecane, hexadecane, octadecane and octadecene.

* * * * *